(12) United States Patent
Wehlus et al.

(10) Patent No.: US 9,772,515 B2
(45) Date of Patent: Sep. 26, 2017

(54) OPTICAL ELEMENT AND ORGANIC LIGHT-EMITTING DEVICE WITH OPTICAL ELEMENT

(71) Applicant: OSRAM OLED GmbH, Regensburg (DE)

(72) Inventors: Thomas Wehlus, Lappersdorf (DE); Arne Fleißner, Regensburg (DE); Daniel Riedel, Regensburg (DE); Johannes Rosenberger, Regensburg (DE)

(73) Assignee: OSRAM OLED GmbH (DE)

( * ) Notice: Subject to any disclaimer, the term of this patent is extended or adjusted under 35 U.S.C. 154(b) by 0 days.

(21) Appl. No.: 15/039,222

(22) PCT Filed: Nov. 27, 2014

(86) PCT No.: PCT/EP2014/075844
§ 371 (c)(1),
(2) Date: May 25, 2016

(87) PCT Pub. No.: WO2015/078984
PCT Pub. Date: Jun. 4, 2015

(65) Prior Publication Data
US 2017/0023806 A1 Jan. 26, 2017

(30) Foreign Application Priority Data

Nov. 29, 2013 (DE) .................. 10 2013 113 269
Jan. 23, 2014 (DE) .................. 10 2014 100 767

(51) Int. Cl.
*G02F 1/01* (2006.01)
*G02B 6/00* (2006.01)
(Continued)

(52) U.S. Cl.
CPC .............. *G02F 1/0126* (2013.01); *E06B 9/24* (2013.01); *G02B 5/208* (2013.01); *G02B 6/00* (2013.01);
(Continued)

(58) Field of Classification Search
CPC . G02F 1/01; G02F 1/0126; G02F 1/03; G02B 6/00; G02B 6/005; G02B 6/0053;
(Continued)

(56) References Cited

U.S. PATENT DOCUMENTS 5,351,151 A * 9/1994 Levy .................... G02B 3/0043
359/237
6,483,735 B1 * 11/2002 Rentzepis .............. B82Y 10/00
365/119

(Continued)

FOREIGN PATENT DOCUMENTS

DE         101 12 542 A1    10/2002
DE    20 2007 015 925 U1    3/2008
(Continued)

OTHER PUBLICATIONS

M. Mennig et al., "Development of fast switching photochromic coatings on transparent plastics and glass," Thin Solid Films 351 (1-2): Aug. 1999, pp. 230-234.

*Primary Examiner* — Loha Ben
(74) *Attorney, Agent, or Firm* — DLA Piper LLP (US)

(57) ABSTRACT

An optical element includes a light guide plate with a first major surface and with a second major surface opposite the first major surface and with side faces connecting the first and second major surfaces, wherein the light guide plate includes a matrix material transparent to ultraviolet light in which scattering centers are embedded, at least one light-emitting semiconductor device that couples ultraviolet light into the light guide plate via a side face when in operation, (Continued)

a first filter layer on the first major surface and a second filter layer on the second major surface, wherein the filter layers opaque to ultraviolet light and at least partially transparent to visible light, and a first photochromic layer at least on the first major surface, between the light guide panel and the first filter layer, with a transparency to visible light by ultraviolet light.

20 Claims, 3 Drawing Sheets

(51) Int. Cl.
 H01L 51/52 (2006.01)
 G02B 5/20 (2006.01)
 G02B 6/10 (2006.01)
 F21V 8/00 (2006.01)
 E06B 9/24 (2006.01)
(52) U.S. Cl.
 CPC .......... *G02B 6/102* (2013.01); *H01L 51/5268* (2013.01); *E06B 2009/247* (2013.01); *E06B 2009/2417* (2013.01); *E06B 2009/2464* (2013.01); *G02B 6/005* (2013.01)

(58) Field of Classification Search
 CPC G02B 6/102; G02B 5/208; E06B 9/24; E06B 2009/2417; E06B 2009/2464; E06B 2009/247; H01L 51/5268
 USPC ............ 359/240, 241; 428/304.4, 332, 336; 315/149; 435/7.23; 365/119; 313/512
 See application file for complete search history.

(56) References Cited

U.S. PATENT DOCUMENTS

| 7,742,673 | B2* | 6/2010 | Li | H01L 51/529 |
| | | | | 313/46 |
| 7,898,176 | B2* | 3/2011 | Li | H05K 7/20981 |
| | | | | 313/46 |
| 8,058,802 | B2* | 11/2011 | Li | H05K 7/20963 |
| | | | | 313/483 |
| 2004/0238837 | A1 | 12/2004 | Jacob et al. | |
| 2011/0133672 | A1 | 6/2011 | Tsang et al. | |

FOREIGN PATENT DOCUMENTS

| JP | 2009-051133 A | 3/2009 |
| WO | 2010/066245 A1 | 6/2010 |
| WO | 2011/162630 A1 | 12/2011 |
| WO | 2013/098707 A2 | 7/2013 |
| WO | 2013/123592 A1 | 8/2013 |

* cited by examiner

OPTICAL ELEMENT AND ORGANIC LIGHT-EMITTING DEVICE WITH OPTICAL ELEMENT

TECHNICAL FIELD

This disclosure relates to an optical element, in particular an optical element with variable transparency, and an organic light-emitting device with an optical element.

BACKGROUND

To prevent undesirable visual intrusion into the interior of a room, house or vehicle, glass windows are known which have variable tinting and variable transparency. For example, such windows may be switched between a light-transmissive state and a milky, diffusely scattering state. Glasses used for this purpose are also known as "LC glasses" (LC: liquid crystal) since the variable transparency is achieved by the use on the window pane of liquid crystals which are electrically activated. To this end, the liquid crystals are arranged between electrode layers and electrically oriented as required. The electrode layers required for this purpose, which have to be simultaneously transparent and sufficiently conductive even in large-area applications, result in high costs, however.

It could therefore be helpful to provide an optical element with variable transparency as well as an organic light-emitting device with such an optical element.

SUMMARY

We provide an optical element including a light guide plate with a first major surface and a second major surface opposite the first major surface and with side faces connecting the first and second major surfaces, wherein the light guide plate includes a matrix material transparent to ultraviolet light in which scattering centers are embedded, at least one light-emitting semiconductor device that couples ultraviolet light into the light guide plate via a side face when in operation, a first filter layer on the first major surface and a second filter layer on the second major surface, wherein the filter layers are opaque to ultraviolet light and at least partially transparent to visible light and a first photochromic layer at least on the first major surface, between the light guide plate and the first filter layer, with a transparency to visible light variable by ultraviolet light.

We also provide an organic light-emitting device including a substrate formed by the optical element including a light guide plate with a first major surface and a second major surface opposite the first major surface and with side faces connecting the first and second major surfaces, wherein the light guide plate includes a matrix material transparent to ultraviolet light in which scattering centers are embedded, at least one light-emitting semiconductor device that couples ultraviolet light into the light guide plate via a side face when in operation, a first filter layer on the first major surface and a second filter layer on the second major surface, wherein the filter layers are opaque to ultraviolet light and at least partially transparent to visible light and a first photochromic layer at least on the first major surface, between the light guide plate and the first filter layer, with a transparency to visible light variable by ultraviolet light, and a functional layer stack on the substrate with at least one organic light-emitting layer between two electrodes.

DETAILED DESCRIPTION

Figure 1A:
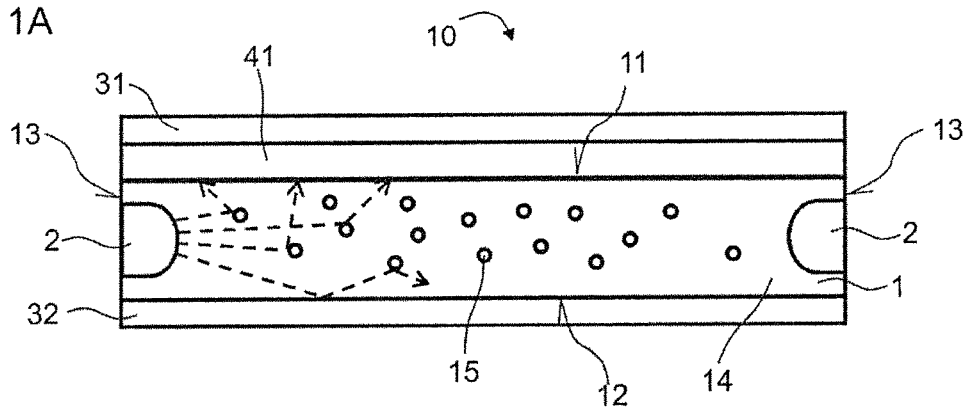
FIG. 1A is a schematic representation of an optical element according to one example.

Our optical element may comprise a light guide plate with a first major surface and a second major surface opposite the first major surface. Furthermore, the light guide plate may comprise side faces connecting the major surfaces. The light guide plate may, for example, be cuboidal, wherein the dimensions of the major surfaces defining a length and width of the light guide plate are greater than a height of the light guide plate defined by the side faces. Alternatively, the major surfaces may also have a shape other than rectangular, for example, a circular shape, an elliptical shape, an n-angular (n≥3) shape, a free form or a combination thereof. The side faces may be planar. Furthermore, the side faces may also be curved or have two or more sub-faces arranged at angles to one another.

The light guide plate may comprise a matrix material at least partially transparent to ultraviolet light in which scattering centers are embedded. In addition to being transparent to ultraviolet light, the matrix material may in particular also be at least partially transparent to light in the visible spectral range. The matrix material is preferably at least partially transparent over the entire visible spectral range. "Transparent" here and hereinafter denotes the property of being clearly transmissive to light. The transparency may be variable by varying the degree of tinting and/or by varying the degree of diffuse scattering. The optical element may, for example, be configured as a window, door, wall or cover or at least as part thereof due to the at least partially present transparency of the matrix material to visible light.

The light guide plate may comprise as a matrix material a glass, in particular a glass at least partially transparent to ultraviolet light, and/or a plastics material, in particular a plastics material at least partially transparent to ultraviolet light. For example, the light guide plate may comprise or consist of quartz as a matrix material. Furthermore, the matrix material may, for example, comprise or consist of borosilicate glass or another glass that may at least partially transmit at least one sub-range of ultraviolet radiation. Furthermore, the matrix material may comprise or consist of plastics material, for example, polymethyl methacrylate (PMMA) that is at least partially transparent to ultraviolet light.

The scattering centers embedded in the matrix material may have a refractive index different from the refractive index of the matrix material at least for ultraviolet light. For example, the scattering centers may comprise or be configured as scattering particles comprising one or more of the following materials: aluminum oxide, titanium oxide, zirconium oxide, silicon oxide, zinc oxide, indium-tin oxide and tin oxide. Furthermore, the scattering centers may, for example, also comprise or be formed by pores, i.e., cavities in the matrix material containing a gas, for example, air or vacuum. A suitable matrix material with scattering centers is also obtainable from Evonik under the trade name PLEXIGLAS® EndLighten.

The light guide plate may have a transparency which for an external observer is identical or substantially identical to a transparency of the matrix material without scattering centers. In other words, the light guide plate may have a transparency which in the visible spectral range is identical or substantially identical to the transparency of the matrix material without scattering centers. An identical or substantially identical transparency means that the transparency of the light guide plate, i.e., the transparency of the matrix material with the scattering centers, differs from the transparency of the matrix material without scattering centers by at most 20% or by at most 10% or by at most 5% or preferably by at most 1%. To achieve such minimal influence by the scattering centers on the transparency of the matrix material in the visible spectral range, while in the ultraviolet spectral range the scattering centers preferably cause greater scatter, the scattering centers may be purposefully adapted to the matrix material in respect of concentration, size and material.

The optical element may comprise a first filter layer on the first major surface of the light guide plate and a second filter layer on the second major surface of the light guide plate, wherein the filter layers are opaque to ultraviolet light and at least partially transparent to visible light. Opaque to ultraviolet light means in particular that the transparency of the filter layers to ultraviolet light is less than or equal to 10%, less than or equal to 5%, preferably less than or equal to 1% or particularly preferably substantially equal to 0%. In contrast, the transparency to visible light is preferably as great as possible, i.e., for example, greater than or equal to 50%, greater than or equal to 60%, greater than or equal to 75% or even greater than or equal to 90%.

The filter layers may, for example, be absorbing to ultraviolet light and comprise a material having a high absorption coefficient for ultraviolet light and as low as possible an absorption coefficient for visible light. For example, the filter layers may comprise a plastics material or a glass having low transparency to ultraviolet light. The glass and/or the plastics material may to this end also comprise suitable additives for the absorption of ultraviolet light. For example, the filter layers may comprise organic, ultraviolet light-absorbing materials, for instance one or more selected from benzophenone, benzotriazole, phenyltriazine, oxidonitrides and oxidonitriles.

Alternatively or in addition, the filter layers may also comprise inorganic, ultraviolet light-absorbing materials, for instance $TiO_2$. Furthermore, the first and/or the second filter layer(s) may also be at least in part reflective to ultraviolet light and preferably transmissive to visible light. To this end, the first and/or the second filter layer(s) may, for example, take the form of or comprise a selective mirror having maximally high reflectivity in the ultraviolet spectral range and maximally high transparency in the visible spectral range. For example, the first and/or the second filter layer(s) may to this end comprise or consist of a Bragg reflector. The filter layers may, for example, take the form of self-supporting elements, in particular of film or plate, or indeed of coating.

The optical element may comprise at least on the first major surface between the light guide plate and the first filter layer a first photochromic layer with a transparency variable by ultraviolet light. In particular, the variable transparency is in the visible spectral range. Furthermore, the optical element may also additionally comprise on the second major surface between the light guide plate and the second filter layer, a second photochromic layer with a transparency variable by ultraviolet light, in particular in the visible spectral range. The first and second photochromic layers may be identically or indeed differently configured. The examples stated below for photochromic layers apply equally to the first and second photochromic layers.

The first and/or second photochromic layer(s) may in particular exhibit a change in the absorption spectrum for visible light under irradiation with ultraviolet light. In this case, absorption of ultraviolet photons and associated energy consumption may lead, by way of various known mechanisms, to a change in the absorption in the visible spectral range. For example, temporarily open bonds, i.e., conversion of molecules into another species, and also excitation of electrons in molecules may lead to a change in the absorption in the visible spectral range. Photochromic materials for the first and/or second photochromic layer(s) are obtainable, for example, from Tokuyama Corporation and have been made known by the Thürfingische Institut für Textil-und Kunststoff-Forschung e.V. (TITK=Thuringian Institute of Textile and Plastics Research). Furthermore, M. Mennig et al., "Development of Fast Switching Photochromic Coatings and Transparent Plastics and Glass," Thin Solid Films 351(1-2), pp. 230-234, 3 Aug. 1999, describes materials and material mixtures of commercially obtainable photochromic materials taking on tinting on exposure to ultraviolet light. The materials and material mixtures described therein are incorporated herein in their entirety by reference.

For example, a photochromic layer, i.e., the first and/or the second photochromic layer(s), may have a transparency to visible light that increases as the intensity of ultraviolet light increases. This means, in other words, that the photochromic layer becomes all the more transmissive to visible light, the more ultraviolet light is irradiated onto the photochromic layer. If no ultraviolet light is irradiated onto the photochromic layer, this may be opaque or partially transmissive to visible light. For example, such a photochromic layer may, in the absence of irradiated ultraviolet light, have a transparency of less than or equal to 30%, less than or equal to 20%, less than or equal to 10%, less than or equal to 5% or even less than or equal to 1%, while, through the irradiation of ultraviolet light up to an intensity limit, a transparency to visible light of greater than or equal to 50%, greater than or equal to 60%, greater than or equal to 75% or preferably greater than or equal to 90% may be achieved.

As an alternative, the optical element may comprise a photochromic layer, i.e., the first and/or the second photochromic layer(s) having a transparency to visible light that reduces as the intensity of ultraviolet light increases. In other words, such a photochromic layer may be all the more opaque to visible light, the more ultraviolet light is irradiated onto the photochromic layer. Without irradiation of ultraviolet light, such a photochromic layer may, for example, have a transparency to visible light of greater than or equal to 50%, greater than or equal to 60%, greater than or equal to 75% or preferably greater than or equal to 90%, while the transparency to visible light decreases as the intensity of irradiated ultraviolet light increases. At an intensity limit of ultraviolet light, such a photochromic layer may also be opaque to visible light, i.e., transmit a proportion of less than or equal to 10%, less than or equal to 5% and preferably less than or equal to 1% of visible light.

Furthermore, a photochromic layer, i.e., the first and/or the second photochromic layer(s), may appear colored in a non-transparent and/or in a partially transparent state. This means that, in other words, such a photochromic layer only transmits visible light in specific wavelength ranges. Such a photochromic layer may thus comprise tinting in a non-transparent and/or in a partially transparent state. The colored appearance or the tinting of such a photochromic layer may in particular be variable by ultraviolet light.

It may moreover be possible for the photochromic layers to be configured differently. By using two different photochromic layers it is possible additionally to influence the tinting effect of the optical element, the maximum degree of which depends inter alia on the thickness and concentration of the material in the photochromic layers. For example, a combination of photochromic materials may also be used in the first and second photochromic layers such that with increasing intensity of ultraviolet light the first photochromic layer changes color while the second photochromic layer becomes decolored. If the photochromic layers are differently tinted in the respective colored states, the optical element may be varied continuously between two colored states or between tinting of two different colors.

The optical element may comprise at least one light-emitting semiconductor device that couples ultraviolet light into the light guide plate when in operation. The light guide plate and the at least one light-emitting semiconductor device thus form an area light source for ultraviolet light. In particular, the at least one light-emitting semiconductor device may couple ultraviolet light into the light guide plate via a side face thereof. The light-emitting semiconductor device may in particular take the form of an inorganic light-emitting semiconductor device, for example, a light-emitting diode chip or light-emitting diode device with an inorganic radiation-emitting layer sequence based on a nitride compound semiconductor material system. Such semiconductor devices are known and therefore not explained in greater detail.

The at least one light-emitting semiconductor device may, for example, be applied to a planar side face of the light guide plate or be arranged in front of a planar side face. Furthermore, the side face may also comprise a recess in which the at least one light-emitting semiconductor device is arranged. Furthermore, the side face may also be curved or comprise two or more sub-faces arranged at an angle to one another, wherein the at least one light-emitting semiconductor device may be arranged on one of the sub-faces or in a recess in one of the sub-faces.

Furthermore, a plurality of light-emitting semiconductor devices that emit ultraviolet light when in operation may also be arranged on one side face of the light guide plate and couple ultraviolet light into the light guide plate via the side face when in operation. Furthermore, the at least one light-emitting semiconductor device may also comprise at least two light-emitting semiconductor devices that couple ultraviolet light into the light guide plate via at least two different side faces when in operation. In other words, the optical element may comprise a plurality of ultraviolet light-emitting semiconductor devices arranged on different side faces of the light guide plate.

The at least one or indeed the plurality of light-emitting semiconductor devices are in particular configured such that no visible light is emitted. This means, in other words, that the at least one or the plurality of light-emitting semiconductor devices only emit ultraviolet or only ultraviolet and infrared light.

The optical element described herein is distinguished by the use of photochromic materials on an area light source emitting ultraviolet light, which area light source is formed by the light guide plate and the at least one light-emitting semiconductor device. The filter layers are capable of preventing the exit of ultraviolet light from the optical element and also penetration of ultraviolet light from the surrounding environment. Start-up of the at least one light-emitting semiconductor device may change the absorption of the photochromic materials for visible light in the first and/or second photochromic layer(s) such that a change in the tinting of the optical element and thus a change in the transparency of the optical element to visible light may take place. The change in transparency to visible light or the change in tinting of the optical element may depend on the thickness, material used and concentration thereof in the first and/or second photochromic layer(s). As described above, the optical element may be configured such that it takes on color or indeed becomes decolored when irradiated with ultraviolet light by the at least one light-emitting semiconductor device.

Furthermore, it may also be possible for different photochromic materials to be used in a photochromic layer, i.e., the first and/or second photochromic layer(s) that have different absorption bands for ultraviolet light. By changing the wavelength of the ultraviolet light irradiated into the light guide plate, different photochromic materials may thus be influenced such that different tinting effects may be obtained. To achieve different wavelengths of the ultraviolet light, light-emitting semiconductor devices may, for example, be used which have a current-dependent emission spectrum. It is moreover also possible, for example, to use light-emitting semiconductor devices with different ultraviolet light spectra that may be purposefully activated depending on the desired ultraviolet light spectrum.

In a method of operating the optical element, the intensity of the ultraviolet light emitted by the at least one light-emitting semiconductor device may be varied by adjusting the operating current of the at least one light-emitting semiconductor device in continuous operation or by pulse width modulation. By varying the intensity of the ultraviolet light emitted by the at least one light-emitting semiconductor device, it may be possible to continuously adjust the variation in transparency to visible light of the optical element and/or the tinting thereof.

Compared to known solutions using LC glasses that require costly conductive and transparent layers, the optical element described herein may be substantially constructed from electrically inactive layers and thus be markedly less expensive. In particular, the structure described herein of the optical element may result very favorably in a continuously tintable pane of virtually any desired size.

Our organic light-emitting device may comprise a substrate formed by an above-described optical element. In particular, the substrate of the organic light-emitting device may be configured in accordance with one or more of the above-described examples of the optical element. Furthermore, the organic light-emitting device comprises at least one functional layer stack on the optical element configured as a substrate, which stack comprises at least one organic light-emitting layer between two electrodes. In particular, the organic light-emitting device may be configured as an organic light-emitting diode (OLED) comprising a substrate with the properties of the above-described optical element. The organic light-emitting device may in particular be configured such that light generated in the functional layer stack when in operation is emitted through the substrate, i.e., through the optical element forming the substrate.

The first photochromic layer may be arranged between the functional layer stack and the light guide plate. In other words, the functional layer stack may be arranged on the first major surface of the light guide plate and in particular on the first filter layer. Alternatively, it is also possible for the first photochromic layer to be arranged on the first major surface remote from the functional layer stack of the light guide plate. In other words, the light guide plate is arranged between the first photochromic layer and the functional layer stack such that the functional layer stack is arranged on the second major surface of the light guide plate and in particular on the second filter layer.

The functional layer stack may be arranged directly on one of the filter layers, i.e., on the first filter layer or the second filter layer, of the optical element. For example, the functional layer stack may comprise an electrode applied directly to one of the filter layers of the optical element. As an alternative to direct application of the functional layer stack to the optical element, the organic functional device may also comprise a substrate on which the functional layer stack is produced by application, wherein the production substrate is arranged together with the functional layer stack on the optical element.

Furthermore, it may also be possible for the filter layer facing the functional layer stack to be formed by the electrode of the functional layer stack facing the optical element. In other words, that filter layer of the optical element and that electrode of the functional layer stack located between the light guide plate and the at least one organic functional layer may thus take the form of a single layer electrically conductive and opaque to ultraviolet light. For example, such a layer, which is configured simultaneously as an electrode and as a filter layer, may comprise indium-tin oxide, which may absorb ultraviolet light.

A photochromic layer of the optical element, i.e., at least the first photochromic layer or also the first and second photochromic layers, may be transparent to light emitted by the functional layer stack when in operation which is variable by ultraviolet light. In this way, it can be ensured that light generated by the functional layer stack when in operation may be influenced and varied by the optical element in the event of a change in the intensity of the ultraviolet light emitted by the at least one light-emitting semiconductor device. In particular, tinting and/or darkening of the organic light-emitting device may be effected by the optical element configured as a substrate, without the intensity of the light emitted by the functional layer stack having to be varied.

The structure of the organic light-emitting device allows an OLED to be produced which may change color when in operation. In this case, the decision as to whether the OLED is to be of variable color may also be made retrospectively, i.e., after production of the OLED since the optical element and in particular at least the first photochromic layer does not have to lie between the functional layer stack and a substrate for the functional layer stack, but may also be applied to the outside of the substrate. In this way, the structure of the organic light-emitting device is compatible with the existing prior art of producing organic light-emitting devices since our elements may also be applied retrospectively, i.e., after production of an organic light-emitting device.

Further advantages and developments are revealed by the examples described below in conjunction with the figures.

In the examples and figures, identical, similar or identically acting elements are provided with the same reference numerals. The elements illustrated and their size ratios to one another should not be regarded as being to scale, but rather individual elements such as, for example, layers, components, devices and regions, may have been made exaggeratedly large to illustrate them better and/or to aid comprehension.

FIG. 1A shows an optical element 10 according to one example. The optical element 10 comprises a light guide plate 1 with a first major surface 11, with a second major surface 12 opposite the first major surface, and with side faces 13 that connect the major surfaces 11 and 12. The light guide plate 1 is configured in particular such that the major surfaces 11, 12 are greater in extent than the height of the light guide plate 1 defined by the side faces 13. The light guide plate 1 comprises a matrix material 14 at least partially transparent to ultraviolet light. Scattering centers 15, which are suitable for scattering ultraviolet light, are embedded in the matrix material 14. To this end, the scattering centers 15 have a refractive index in the ultraviolet spectral range different from the refractive index of the matrix material 14. The scattering centers 15 may, for example, take the form of particles or pores. The matrix material 14 may, for example, be or comprise a glass. Alternatively or in addition, the matrix material 14 may also comprise a plastics material at least partially transparent to ultraviolet light. Suitable materials for the matrix material 14 and the scattering centers 15 are described above.

The light guide plate 1 is configured in particular as a light guide with a weakly scattering action in the visible spectral range. This means that the light guide plate 1 has a transparency to visible light which preferably does not differ or differs only slightly from the transparency of the matrix material 14 without scattering centers 15. In particular, the light guide plate 1 may have a transparency to visible light that for an external observer is identical or substantially identical to a transparency in the visible spectral range of the matrix material 14 without scattering centers. Preferably, the transparency of the light guide plate 1 may differ from the transparency of the matrix material 14 without scattering centers 15 by 20% or less, preferably 10% or less or 5% or less and particularly preferably 1% or less.

Furthermore, the optical element 10 comprises at least one light-emitting semiconductor device 2 that emits ultraviolet light when in operation. In the example shown, at least two light-emitting semiconductor devices 2 are provided. The light-emitting semiconductor devices 2 are arranged at side faces 13 of the light guide plate 1 and when in operation emit ultraviolet light via the side faces 13 into the light guide plate 1. To this end, the light guide plate 1 comprises suitable recesses in the side faces 13 in which the light-emitting semiconductor devices 2 are arranged. Alternatively, the light-emitting semiconductor devices 2 may, for example, also be arranged on planar side face 13 or a plurality of planar side faces 13. A plurality of light-emitting semiconductor devices 2 may also be present on one or more side faces 13.

As indicated by the dashed arrows, the light-emitting semiconductor devices 2 emit ultraviolet light into the light guide plate 1 which is scattered at the scattering centers 15 towards the major surfaces 11, 12. At the same time, light guide effects caused by total reflection may also be reduced by the scattering centers 15. The optical element 10 preferably comprises a suitable number of light-emitting semiconductor devices 2 on one or more side faces 13 and a suitable concentration and material selection for the scattering centers 15 such that the major surfaces 11, 12 may be irradiated maximally uniformly and homogeneously with ultraviolet light.

The light-emitting semiconductor devices 2 are configured, for example, as packaged or unpackaged light-emitting diode chips based on an inorganic compound semiconductor material system. In particular, the light-emitting semiconductor devices 2 may comprise a light-emitting semiconductor layer sequence based on a nitride compound semiconductor material system. By way of suitable contacts and supply lines, which are not shown for clarity's sake, the light-emitting semiconductor devices 2 may be activated.

By controlling the operating current, for example, in the form of a constant current or in the form of pulse width modulation, it is possible to adjust the intensity of the ultraviolet light irradiated into the light guide plate 1. It is accordingly possible to adjust the intensity of the ultraviolet light exiting from the light guide plate 1 via the major surfaces 11, 12. The side faces 13 may, for example, also comprise suitable mirroring or absorber layers such that no ultraviolet light can exit the light guide plate 1 via the side faces 13.

On the first and second major surfaces 11, 12 of the light guide 1, a first filter layer 31 and a second filter layer 32 which are furthermore arranged are each opaque to ultraviolet light. The filter layers 31, 32 may, for example, take the form of absorber layers and/or reflective layers that may absorb and/or reflect ultraviolet light. Furthermore, both the light guide plate 1 and the filter layers 31, 32 are configured to be maximally transparent to visible light. The filter layers 31, 32 in particular prevent ultraviolet light generated by the light-emitting semiconductor devices 2 from being able to exit the optical element 10. Furthermore, the filter layers 31, 32 also prevent ultraviolet light from the surrounding environment from being irradiated into the optical element 10. Accordingly, the filter layers 31, 32 may, for example, form the outer layers of the optical element 10 on the major surfaces 11, 12 of the light guide plate 1.

Furthermore, on the first major surface 11 of the light guide plate 1, the optical element 10 comprises a first photochromic layer 41 arranged between the light guide plate 1 and the first filter layer 31. The first photochromic layer 41 comprises a photochromic material that, when irradiated with ultraviolet light, undergoes a change in the absorption spectrum for visible light. In this way, it may be ensured that the transparency of the first photochromic layer 41 to visible light is variable as a function of an intensity of ultraviolet light also irradiated into the first photochromic layer 41. By adjusting the intensity of the ultraviolet light emitted by the light-emitting semiconductor devices 2, the transparency of the first photochromic layer 41 to visible light may thus be continuously adjusted. The first photochromic layer 41 may have a transparency to visible light that increases as the intensity of irradiated ultraviolet light increases. Alternatively, the first photochromic layer 41 may also have a transparency to visible light that decreases as the intensity of irradiated ultraviolet light increases. In this case, the first photochromic layer 41 may also appear colored in a non-transparent and/or in a partially transparent state. This means that the first photochromic layer 41 may be colored or decolored by the ultraviolet light emitted by the light-emitting semiconductor devices 2. In this way, it is possible with the aid of the optical element 10 shown to produce, for example, a window, a door, a wall, a cover or the like with adjustable transparency to visible light or with adjustable tinting. The optical element 10 thus allows optically induced tinting of glass or plastics surfaces that may be formed, for example, by the light guide plate 1. Furthermore, the optical element 10 may also be applied to glass or plastics surfaces, for example, in the form of a laminate.

Figure 1B:
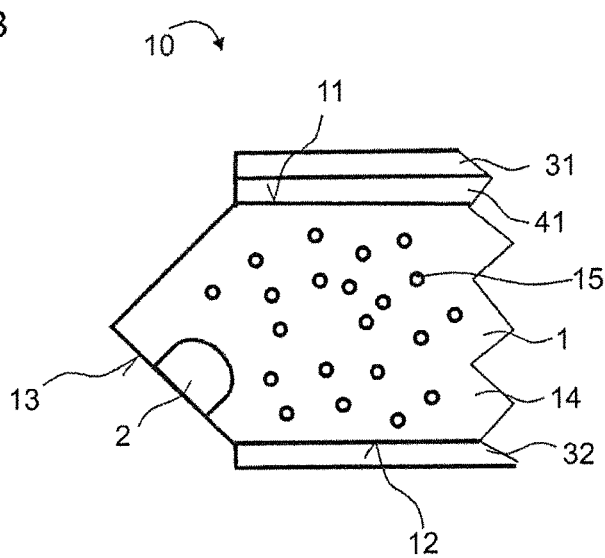
FIG. 1B is a schematic representation of a portion of an optical element according to a further example.

FIG. 1B shows a portion of an optical element 10 according to a further example that, compared to the example of FIG. 1A, comprises side faces 13 that connect the major surfaces 11 and 12 and have sub-faces arranged at angles to one another, wherein the light-emitting semiconductor devices 2 are arranged in one of the sub-faces. Alternatively, the light-emitting semiconductor devices 2 may also be arranged on planar sub-faces. Furthermore, it is also possible for the side faces 13 to be curved, i.e., for example, rounded.

Figure 2:
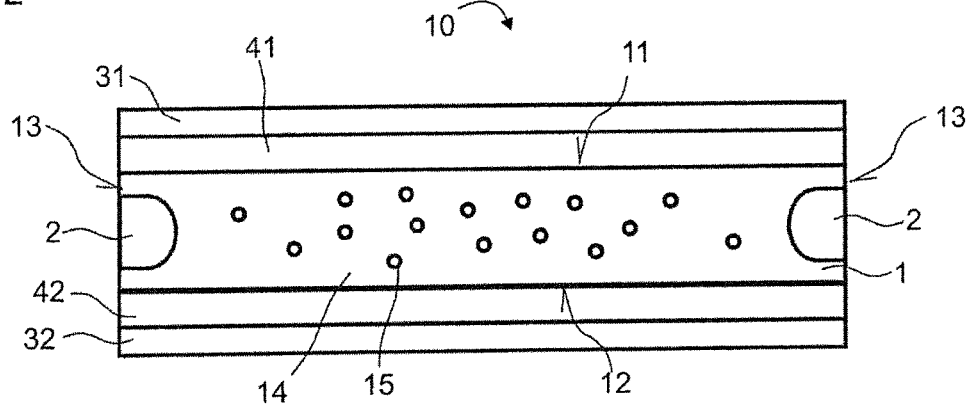
FIG. 2 is a schematic representation of an optical element according to a further example.

FIG. 2 shows an optical element 10 that, compared to the optical element 10 of FIGS. 1A and 1B, comprises a second photochromic layer 42 on the second major surface 12 of the light guide plate 1, which second photochromic layer 42 is arranged between the light guide plate 1 and the second filter layer 32. The photochromic layers 41, 42 may be identical or different, wherein the statements made above in relation to the first photochromic layer 41 apply analogously to the second photochromic layer 42. By using two photochromic layers 41, 42 the tinting effect of the optical element 10, the maximum degree of which depends inter alia on the material thickness and the material concentration in the photochromic layers 41, 42, may additionally be influenced. For example, a combination of photochromic materials may also be used in the first and second photochromic layers 41, 42 such that with increasing intensity of ultraviolet light the first photochromic layer 41 changes color while the second photochromic layer 42 becomes decolored. If the photochromic layers 41, 42 are differently tinted in the respective colored states, the optical element 10 may be continuously varied between two colored states or between tinting of two different colors.

It may moreover also be possible for different photochromic materials having different absorption bands for ultraviolet light to be used in one or in both photochromic layers 41, 42. By changing the wavelength of the ultraviolet light irradiated into the light guide plate 1, different photochromic materials may thus be influenced such that different tinting effects may be obtained. To achieve different wavelengths of the ultraviolet light, light-emitting semiconductor devices 2 may, for example, be used that have a current-dependent emission spectrum. It is moreover also possible, for example, to use light-emitting semiconductor devices 2 with different ultraviolet light spectra that may be purposefully activated depending on the desired ultraviolet light spectrum.

Figure 3A:
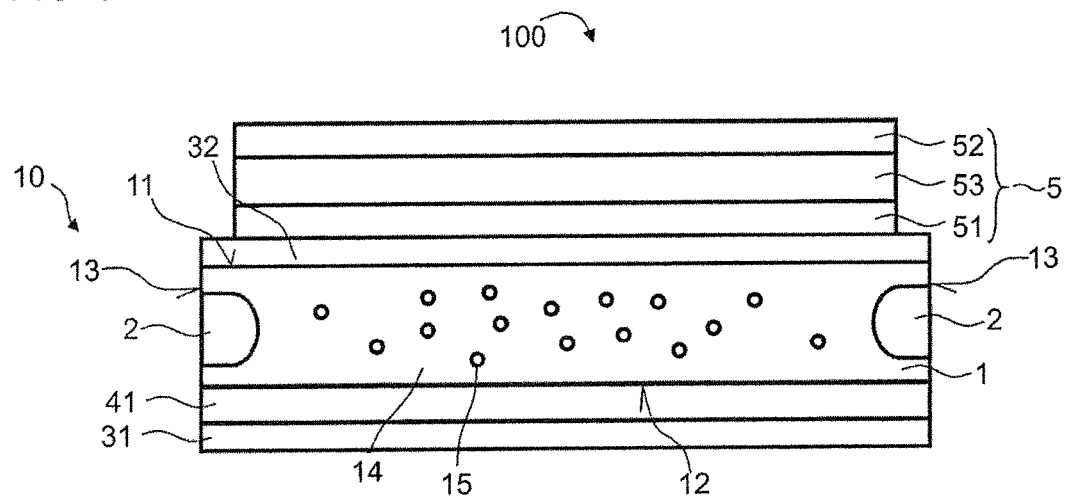
FIGS. 3A to 5 show organic light-emitting devices with optical elements according to further examples.
Figure 3B:
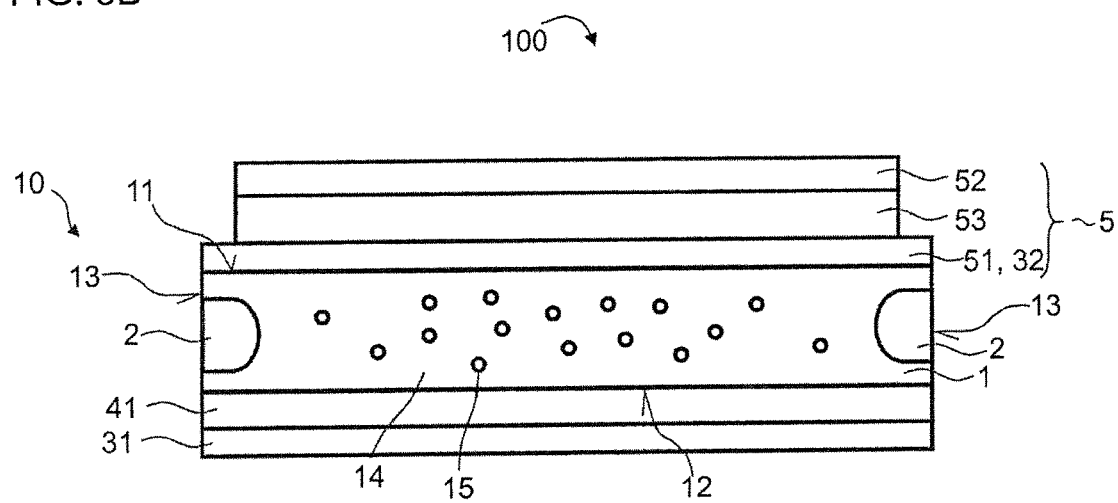
Figure 4:
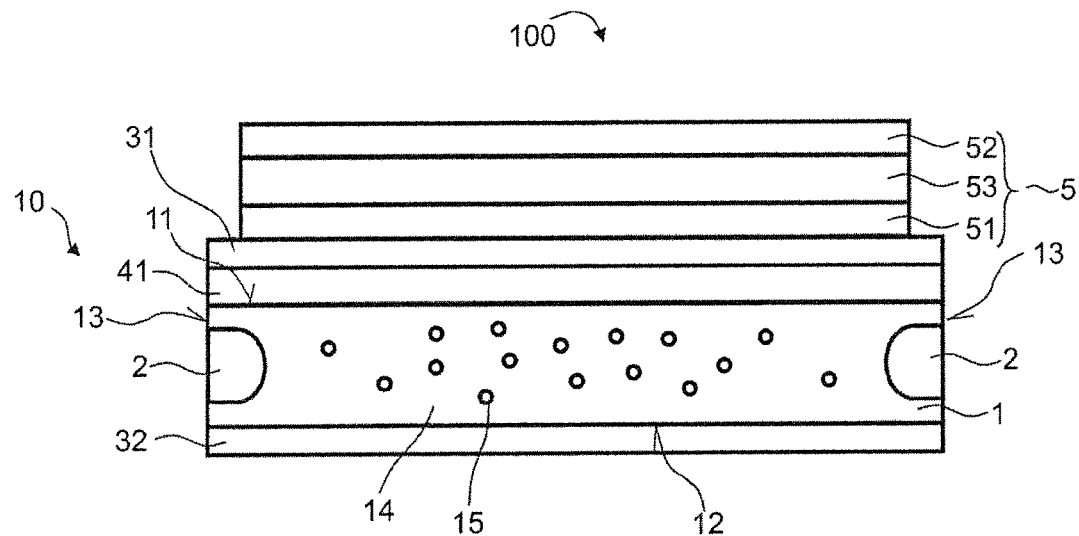
Figure 5:
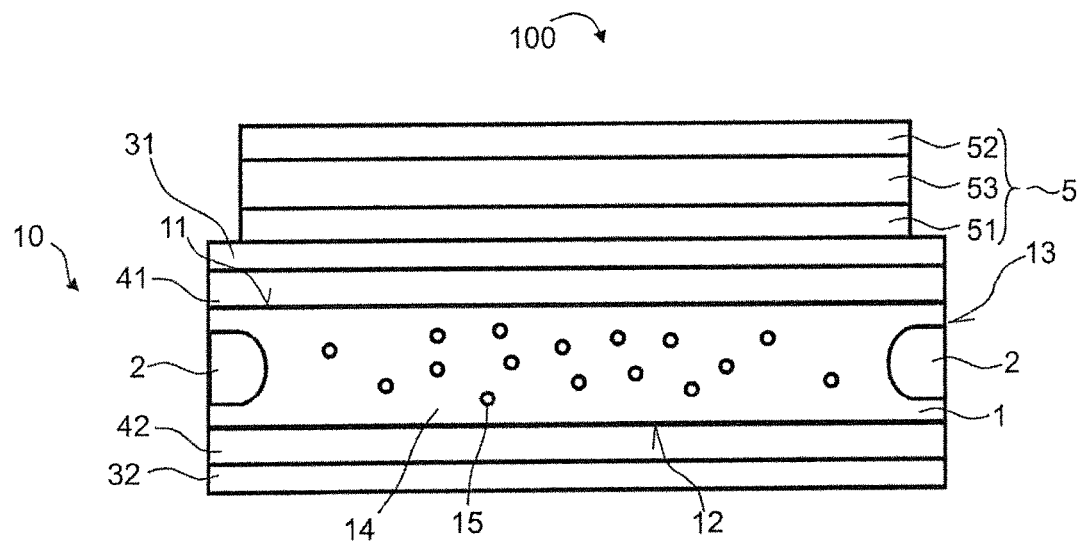

In conjunction with FIGS. 3 to 5, organic light-emitting devices 100 are shown that each have a substrate formed by an optical element 10 according to the above description. A functional layer stack 5 comprising at least one organic light-emitting layer 53 between electrodes 51 and 52 is applied to the optical element 10 configured as a substrate. In particular, the electrode 51, facing the optical element 10, between the optical element 10 and the organic light-emitting layer 53 is configured to be transparent such that light may be radiated by the electrode 51 into and through the optical element 10 when the functional layer stack 5 is in operation.

The organic light-emitting devices 100 of the examples of FIGS. 3 to 5 and in particular the functional layer stack 5 thereof may in particular be configured as organic light-emitting diodes (OLEDs). To this end, the functional layer stack 5 may additionally comprise further organic functional layers as well as, for example, further layers such as for instance an encapsulation. The structure of organic light-emitting devices is known, for example, from WO 2010/066245 A1, which, with regard to the various configurations of organic light-emitting devices, is explicitly incorporated herein in its entirety by reference.

The above-described change in absorption or transmission of visible light by the photochromic layers 41, 42 makes it possible to influence the light emitted by the organic light-emitting device 100 through the optical element 10 regarding its intensity and/or color by adjusting the ultraviolet light emitted by the light-emitting semiconductor devices 2. In particular, the photochromic material may be differently clouded in the photochromic layers 41, 42 depending on the intensity of the ultraviolet light emitted by the light-emitting semiconductor devices 2 and that may, for example, be adjusted by pulse width modulation such that the color of the organic light-emitting device may be simply and appropriately varied. In the organic light-emitting device 100 described here, the optical element 10 thus serves as an optically switchable color filter with which different tinting effects may be achieved by suitable photochromic materials with absorption bands in different wavelength ranges depending on activation of the wavelength.

In contrast thereto, in conventional OLEDs control of the emitted color is generally only possible in that regions or strips with different colors of emission are activated as required and mixed together by a thick diffuser. Alternatively, it is also known to stack components that emit light of different colors on top of one another and activate them individually. Compared to the organic light-emitting device 100 described here, such known approaches are markedly more complex and costly.

As shown in FIG. 3A, the optical element 10 may be configured in accordance with the example of FIG. 1 and comprise just one photochromic layer in the form of the first photochromic layer 41. This may be arranged on the side of the light guide plate 1 remote from the functional layer stack 5 such that the light guide plate 1 is arranged between the functional layer stack 5 and the first photochromic layer 41. The functional layer stack 5 may be applied directly to the filter layer facing it in the case of FIG. 3A the second filter layer 32. This means in particular that the lower electrode 51 may be applied directly to the second filter layer 32.

Alternatively, the lower electrode 51 may also be configured simultaneously as the second filter layer 32, as shown in the example of FIG. 3B. To this end, the layer that simultaneously forms the lower electrode 51 and the second filter layer 32 comprises an electrically conductive and ultraviolet light-reflecting or -absorbing material, for example, indium-tin oxide.

As shown in FIG. 4, the first filter layer 31 may also be arranged on the side of the light guide plate 1 facing the functional layer stack 5 such that the first photochromic layer 41 is arranged between the functional layer stack 5 and the light guide plate 1. In this case too, the lower electrode 51 and the filter layer 31 may be configured as a single layer electrically conductive and opaque to ultraviolet light.

As shown in FIG. 5, the optical element 10 configured as a substrate may also comprise, in addition to the first photochromic layer 41, the second photochromic layer 42 as described in conjunction with the example of FIG. 2.

The description made with reference to examples does not restrict this disclosure to these examples. Rather, the disclosure encompasses any novel feature and any combination of features, including in particular any combination of features in the appended claims, even if the feature or combination is not itself explicitly indicated in the claims or examples.

This application claims priority of DE 10 2013 113 269.3 and DE 10 2014 100 767.0, the subject matter of which are incorporated herein by reference.

The invention claimed is:

1. An optical element comprising:
    a light guide plate with a first major surface and a second major surface opposite the first major surface and with side faces connecting the first and second major surfaces, wherein the light guide plate comprises a matrix material transparent to ultraviolet light in which scattering centers are embedded;
    at least one light-emitting semiconductor device that couples ultraviolet light into the light guide plate via a side face when in operation;
    a first filter layer on the first major surface and a second filter layer on the second major surface, wherein the filter layers are opaque to ultraviolet light and at least partially transparent to visible light; and
    a first photochromic layer at least on the first major surface, between the light guide plate and the first filter layer, with a transparency to visible light variable by ultraviolet light.

2. The optical element according to claim 1, wherein the first and/or second filter layer(s) absorb(s) ultraviolet light.

3. The optical element according to claim 1, wherein the first and/or second filter layer(s) reflect(s) ultraviolet light.

4. The optical element according to claim 1, wherein the first photochromic layer has a transparency to visible light that increases as intensity of the ultraviolet light increases.

5. The optical element according to claim 1, wherein the first photochromic layer has a transparency to visible light that decreases as intensity of the ultraviolet light increases.

6. The optical element according to claim 1, wherein the first photochromic layer appears colored in a non-transparent and/or in a partially transparent state.

7. The optical element according to claim 1, wherein the first photochromic layer has a colored appearance which is variable by ultraviolet light.

8. The optical element according to claim 1, wherein a second photochromic layer having a transparency to visible light variable by ultraviolet light is arranged on the second major surface between the light guide plate and the second filter layer.

9. The optical element according to claim 8, wherein the first and second photochromic layers are similarly configured.

10. The optical element according to claim 8, wherein the first and second photochromic layers are differently configured.

11. The optical element according to claim 1, wherein the light guide plate has a transparency to visible light which for an external observer is identical to a transparency to visible light of the matrix material without scattering centers.

12. The optical element according to claim 1, wherein the at least one light-emitting semiconductor device comprises at least two light-emitting semiconductor devices that couple ultraviolet light into the light guide plate via at least two different side faces when in operation.

13. The optical element according to claim 1, wherein the at least one light-emitting semiconductor device comprises at least two light-emitting semiconductor devices that emit light with different ultraviolet light spectra when in operation.

14. The optical element according to claim 1, wherein the at least one light-emitting semiconductor device does not emit any visible light.

15. An organic light-emitting device comprising:
    a substrate formed by the optical element according to claim 1; and
    a functional layer stack on the substrate with at least one organic light-emitting layer between two electrodes.

16. The organic light-emitting device according to claim 15, wherein the first photochromic layer is arranged between the functional layer stack and the light guide plate.

17. The organic light-emitting device according to claim 15, wherein the light guide plate is arranged between the first photochromic layer and the functional layer stack.

18. The organic light-emitting device according to claim 15, wherein the functional layer stack is arranged directly on one of the filter layers of the optical element.

19. The organic light-emitting device according to claim 15, wherein the functional layer stack comprises at least one organic light-emitting layer between two electrodes, and that filter layer and that electrode arranged between the organic light-emitting layer and the light guide plate are configured as a single layer.

20. The organic light-emitting device according to claim 15, wherein the at least one first photochromic layer has a transparency to light emitted by the functional layer stack when in operation which is variable by ultraviolet light.

* * * * *